(12) United States Patent
Matsuda

(10) Patent No.: US 9,343,405 B2
(45) Date of Patent: May 17, 2016

(54) SEMICONDUCTOR DEVICE AND METHOD OF MANUFACTURING THE SAME

(71) Applicant: Kabushiki Kaisha Toshiba, Minato-ku (JP)

(72) Inventor: Yuya Matsuda, Mie (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/693,962

(22) Filed: Apr. 23, 2015

(65) Prior Publication Data

US 2016/0020169 A1 Jan. 21, 2016

(30) Foreign Application Priority Data

Jul. 17, 2014 (JP) .................................. 2014-146765

(51) Int. Cl.
*H01L 23/48* (2006.01)
*H01L 23/528* (2006.01)
*H01L 21/768* (2006.01)
*H01L 27/115* (2006.01)
*H01L 23/532* (2006.01)
*H01L 21/02* (2006.01)
*H01L 21/311* (2006.01)

(52) U.S. Cl.
CPC .......... *H01L 23/528* (2013.01); *H01L 21/0217* (2013.01); *H01L 21/02164* (2013.01); *H01L 21/31144* (2013.01); *H01L 21/76802* (2013.01); *H01L 21/76831* (2013.01); *H01L 21/76877* (2013.01); *H01L 23/53257* (2013.01); *H01L 23/53295* (2013.01); *H01L 27/11551* (2013.01); *H01L 27/11578* (2013.01)

(58) Field of Classification Search
CPC .... H01L 27/222; H01L 21/8229; H01L 27/24
See application file for complete search history.

(56) References Cited

U.S. PATENT DOCUMENTS

| 7,799,672 B2 | 9/2010 | Hashimoto et al. |
| 8,304,348 B2 | 11/2012 | Hashimoto |
| 2013/0056818 A1 | 3/2013 | Iino et al. |

FOREIGN PATENT DOCUMENTS

| JP | 2010-192646 | 9/2010 |
| JP | 2011-035237 | 2/2011 |
| JP | 2013-055136 | 3/2013 |

*Primary Examiner* — Elias M Ullah
(74) *Attorney, Agent, or Firm* — Oblon, McClelland, Maier & Neustadt, L.L.P.

(57) ABSTRACT

A semiconductor device includes a substrate; a stack structure including a plurality of insulating films and a plurality of metal films disposed alternately one above another. The stack structure is provided above the substrate and has a stairway portion including a plurality of terraces located at least at one end portion thereof. A liner film and a stopper film are disposed so as to cover an upper portion the stack structure in the stairway portion formed of the terraces. A plurality of holes are connected to each of the terraces. Each of the terraces is formed of a stack of the insulating films and the metal films. Each of the holes extends through the stopper film and the liner film and connect to the metal films of the terraces.

11 Claims, 17 Drawing Sheets

SEMICONDUCTOR DEVICE AND METHOD OF MANUFACTURING THE SAME

CROSS-REFERENCE TO RELATED APPLICATION(S)

This application is based upon and claims the benefit of priority from Japanese Patent Application No. 2014-146765, filed on, Jul. 17, 2014 the entire contents of which are incorporated herein by reference.

FIELD

Embodiments disclosed herein generally relate to a semiconductor device and a method of manufacturing the same.

BACKGROUND

In semiconductor devices such as a 3D-NAND nonvolatile semiconductor storage device, a stairway structure may be provided in which a plurality of conductive films and insulating films are stacked one above another. In case a metal film is employed as the conductive films, it is required to form an etch stop film above the metal film when forming holes connecting to the terraces of the stairway structure. However, it has been a challenge to conceive device structures and processes enabling such arrangement.

BRIEF DESCRIPTION OF THE DRAWINGS

FIG. 2A is one example of a planar view and FIG. 2B is one example of a vertical cross-sectional view taken along line 2-2 of FIG. 2A.

FIG. 3A illustrates one example of a planar layout and FIG. 3B illustrates one example of a vertical cross-sectional view taken along line 2-2 of FIG. 3A.

DETAILED DESCRIPTION

Figure 1:
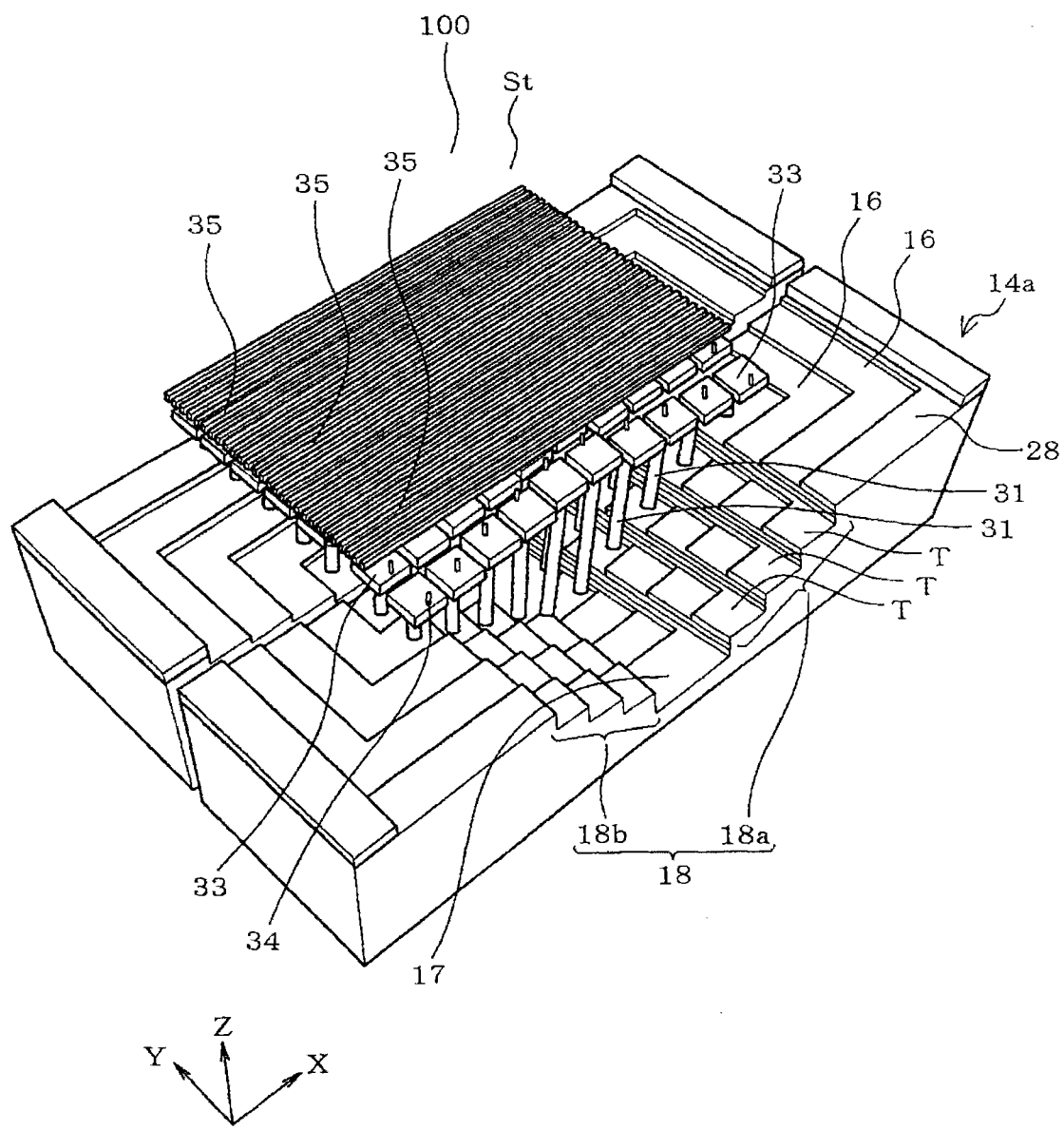
FIG. 1 is one example of a perspective view of a semiconductor storage device of one embodiment.

In one embodiment a semiconductor device includes a substrate; a stack structure including a plurality of insulating films and a plurality of metal films disposed alternately one above another. The stack structure is provided above the substrate and has a stairway portion including a plurality of terraces located at least at one end portion thereof. A liner film and a stopper film are disposed so as to cover an upper portion the stack structure in the stairway portion formed of the terraces. A plurality of holes are connected to each of the terraces. Each of the terraces is formed of a stack of the insulating films and the metal films. Each of the holes extends through the stopper film and the liner film and connects to the metal films of the terraces.

(Embodiments)

Embodiments are described hereinafter with reference to the drawings. In the drawings referred to in the following description, elements that are substantially identical in function or structure are identified with identical or similar reference symbols and may not be re-described. The drawings are schematic and thus, are not necessarily consistent with the actual correlation of thickness to planar dimensions and the actual thickness ratios between each of the layers. Further, directional terms such as up, down, left, and right are used in a relative context with an assumption that the surface, on which circuitry is formed, of the later described semiconductor substrate faces up. Thus, the directional terms do not necessarily correspond to the directions based on gravitational acceleration.

Further, in the following description, XYZ orthogonal coordinate system may be used for convenience of explanation. In the coordinate system, the X direction and the Y direction each indicates a direction parallel to the surface of a semiconductor substrate and crosses orthogonally with one another. Further, the X direction indicates the direction in which the word line extends and the Y direction indicates the direction in which the bit line extends. The direction crossing orthogonally with both the X and the Y direction is referred to as the Z direction.

FIG. 1 is one example of a perspective view illustrating a semiconductor device of one embodiment. One embodiment of a semiconductor device is described hereinafter through an application of 3D-NAND nonvolatile semiconductor storage device.

Referring to FIG. 1, 3D-NAND nonvolatile semiconductor storage device 100 of the present embodiment is provided with stack structure 14a. A portion of stack structure 14a is shaped like a stairway to define stairway region St. Valley 17 is formed in stack structure 14a located in stairway region St. Steps 18a and 18b, collectively referred to as steps 18, are formed which ascend toward both extremes of the X direction. The shapes of steps 18a and 18b are substantially symmetrical with respect to the center of valley 17.

In steps 18a, terrace T is formed for every electrode film 16 and select gate electrode 28. The count of terraces T is equivalent to the sum of the stacked layers of electrode films 16 and select gate electrodes 28. In steps 18a, the height of terrace T located closer to steps 18b is lower than the height of terrace T located farther from steps 18b since steps 18a ascend in the direction away from steps 18b. The heights of terraces T adjacent in the Y direction differ by a height corresponding to one layer of electrode film 16.

Contact 31 is provided in the upper surface of each of terraces T in steps 18a and steps 18b. Contacts 31 are arranged in a matrix with respect to terraces T. Each of contacts 31 are connected to electrode film 16 disposed in the surface of terrace T located in the region immediately under each of contacts 31. FIG. 1 only illustrates some of the contacts to provide good visibility. Conductive film 33 is provided above each of contacts 31 and is connected to the upper end of each contact 31. Via 34 is provided above each conductive film 33 and the lower end of via 34 is connected to conductive film 33. Wire 35 extending in the X direction is provided above via 34. A single line of wire 35 is connected to portions serving as terraces T of steps 18a and 18b of a single electrode film 16 via the corresponding via 34, conductive film 33, and contact 31.

Each wire 35 is connected to electrode film 16 via contact 31. It is thus, possible to apply control signals, generated by a drive circuit not illustrated provided in a peripheral circuit, to electrode film 16 via wire 35. In 3D-NAND nonvolatile semiconductor storage device 100, electrode film 16 serves as a word line and wire 35 serves as a control line for giving control signals to electrode film 16.

Figure 2A:
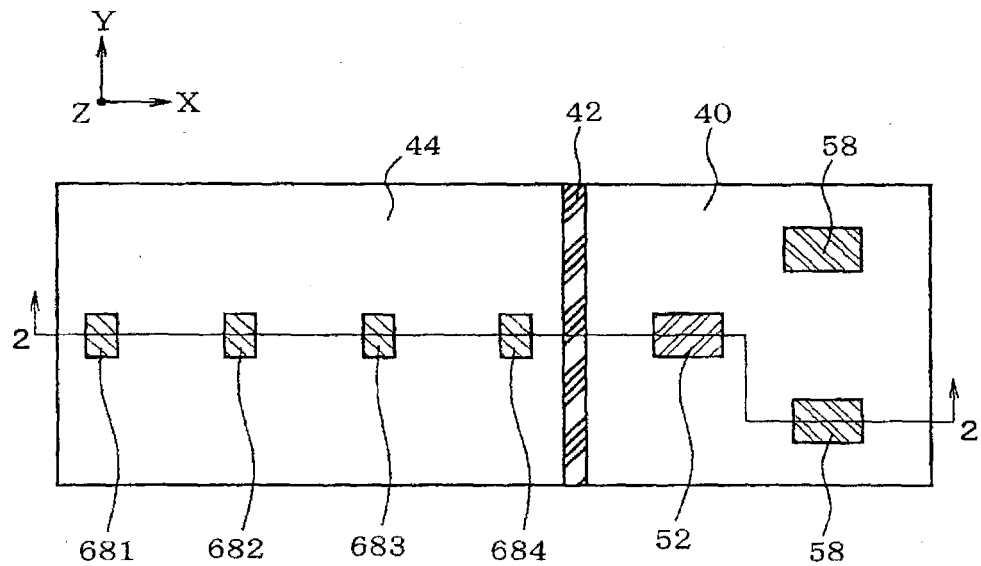
FIGS. 2A and 2B are views schematically illustrating the structure of semiconductor storage device of one embodiment, where
Figure 2B:
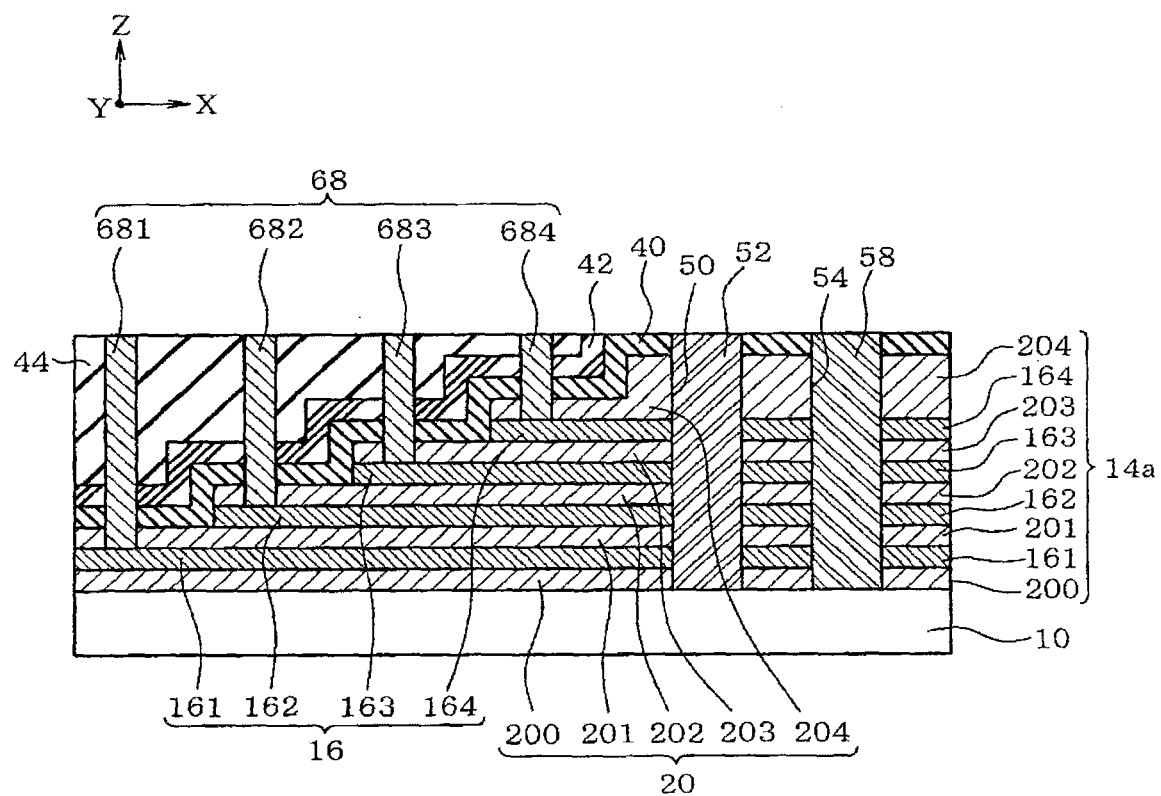

FIGS. 2A and 2B are examples of views schematically illustrating the structure of a semiconductor device of the present embodiment. The semiconductor device partially and schematically illustrated in FIGS. 2A and 2B is a portion of stairway region St of 3D-NAND nonvolatile semiconductor storage device 100 illustrated in FIG. 1. FIG. 2A is one example of a plan view and FIG. 25 is one example of a vertical cross-sectional view taken along line 2-2 of FIG. 2A. In the following description, the term electrode film 16 is used when referring to electrode films 161, 162, 163, and 164 in general. Similarly, the term first insulating film 20 is used when referring to first insulating films 200, 201, 202, 203, and 204 in general.

Referring to FIGS. 2A and 25, first insulating film 200 is formed above semiconductor substrate 10. Electrode film 161 is formed above first insulating film 200. First insulating film 201 is formed above electrode film 161. Electrode film 162 and first insulating film 202 are formed above first insulating film 201. A stack of first insulating film 20 and electrode film 16 is formed repeatedly in a similar manner as represented by 163, 203, 164, and 204. First insulating film 20 comprises a silicon oxide film ($SiO_2$) for example. Electrode film 16 comprises tungsten for example. The stack of first insulating film 20 and electrode film 16 represented by 200 to 204 and 161 to 164 is referred to as stack structure 14a.

Steps 18a and 18b, collectively referred to as steps 18, are each formed of stack structure 14a and each step of steps 18 serves as terrace T. FIGS. 2A and 2B illustrate examples of steps 18 having 4 four steps of terraces T represented by T1, T2, T3, and T4. Liner insulating film 40 and stopper insulating film 42 are formed above each terrace T. Liner insulating film 40 and stopper insulating film 42 are formed of different materials. Liner insulating film 40 and stopper insulating film 42 are stacked above terraces T sa as to extend along the stairway-like shape of steps 18. In the right side portion as viewed in the X direction in the figures, stopper insulating film 42 is removed to expose the liner insulating film 40.

Interlayer insulating film 44 is formed so as to bury the stairway profile of steps 18 and thus, the surface of interlayer insulating film 44 is planarized. The surfaces of interlayer insulating film 44, stopper insulating film 42, and liner insulating film 40 are coplanar to define a continuous surface.

In steps 18, contact plugs 681, 682, 683, and 684 are connected to the upper surfaces of electrode films 16 of terraces T1, T2, T3, and T4, respectively. In the following description, the term contact plug 68 is used when referring to contact plugs 681, 682, 683, and 684 in general. Contact plug 68 extends from the surface of interlayer insulating film 44 and through the intervening layers to reach the surface of electrode films 16 of each of terraces T of steps 18. Contact plug 68 extends through liner insulating film 40 and stopper insulating film 42. Contact plugs 681, 682, 683, and 684 are connected to electrode films 161, 162, 163, and 164, respectively. The amount in which the lower portions of each contact plug 68 is etched into (extending into) the surface of each electrode film 16 is substantially the same. Stated differently, the amount in which the lower portion of each contact plug 68 is etched into (extending into) the surface of each electrode film 16 is substantially the same in electrode film 164 located in the upper terrace T and in electrode film 161 located in the lower terrace T.

First insulating film pillar 52 and second insulating film pillar 58 are formed in the X-direction right side in FIGS. 2A and 2B. First insulating film pillar 52 and second insulating film pillar 58 extend through stack structure 14 from the surface of liner insulating film 40 to reach the surface of semiconductor substrate 10.

As described above, each contact plug 68 is uniquely connected to electrode film 16 of each terrace T of steps 18. Contact plugs 68 extend through interlayer insulating film 44, stopper insulating film 42, and liner insulating film 40 to reach the surfaces of electrode films 16. The amount in which the lower portions of each contact plug 68 is etched into (extending into) the surface of each electrode film 16 is substantially the same. As a result, the above described structure provides an advantageous effect of reducing the variation in the contact resistance between contact plugs 68.

Referring next to FIGS. 2A to 17B, a description will be given on a method of manufacturing the semiconductor device of the present embodiment. FIGS. 2A to 17B are views schematically illustrating a portion of stairway region St of 3D-NAND nonvolatile semiconductor storage device 100 illustrated in FIG. 1 and are presented according to the manufacturing process flow. Figures suffixed by "A" are examples of planar views presented according to the manufacturing process flow. Figures suffixed by "B" are examples of vertical cross-sectional views taken along line 2-2 of figures suffixed by "A".

Figure 3A:
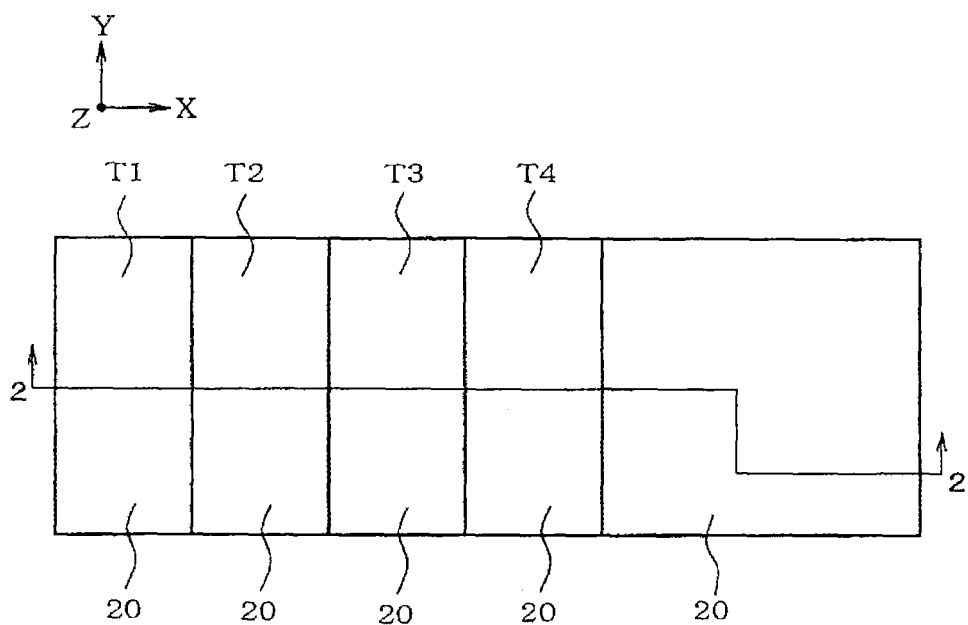
FIGS. 3A and 3B are vertical cross-sectional views schematically illustrating one portion of a stairway region St at one phase of the manufacturing process flow where
Figure 3B:
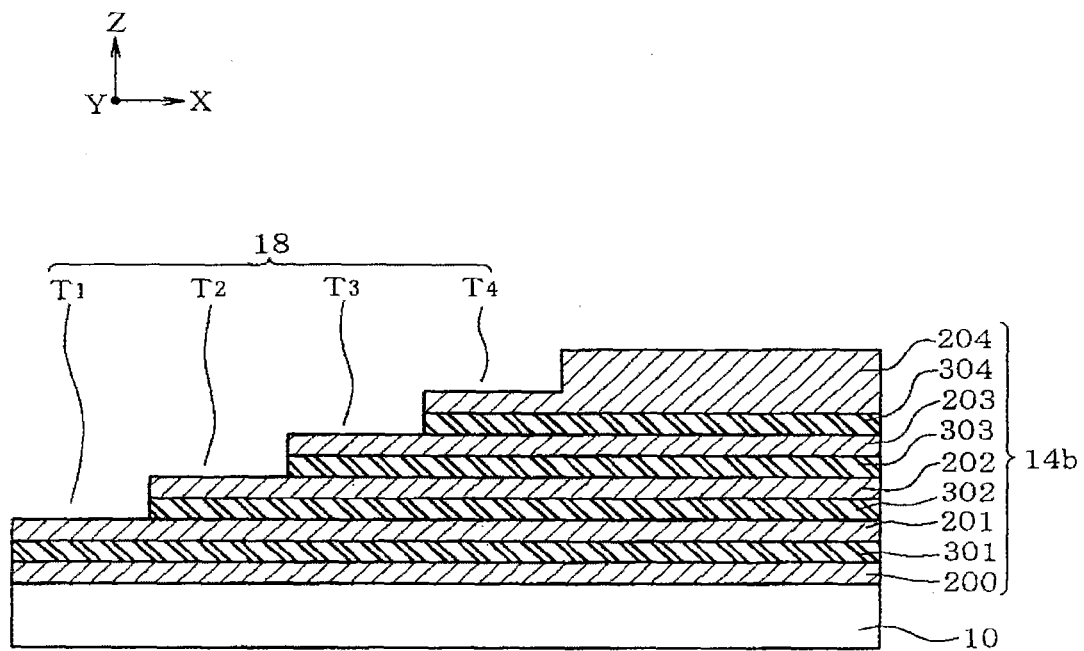

Referring first to FIGS. 3A and 3B, first insulating films 200, 201, 202, 203, and 204 and second insulating films 301, 302, 303, and 304 are formed alternately above semiconductor substrate 10. In the following description, the term "second insulating film 30" will be used when referring to second insulating films 301, 302, 303, and 304 in general. The stack of first insulating films 20 and second insulating films 30 serve as stack structure 14b. Stack structure 14b is a stack of films 200, 301, 201, 302, 202, 303, 203, 304, and 204 formed above semiconductor substrate 10 in the listed sequence.

A silicon oxide film for example may be used as first insulating film, 20. The silicon oxide film may be formed for example by CVD (Chemical Vapor Deposition). A silicon nitride film may be used for example as second insulating film 30. The silicon nitride film may be formed for example by CVD.

Next, terraces T are formed by forming steps 18. The present embodiment is discussed through an example in which four steps of terraces T namely, T1, T2, T3, and T4 listed from the lower side are provided in steps 18. First insulating film 20 is disposed as the upper surface of each terrace T and second insulating film 30 is disposed under first insulating film 20.

Figure 4A:
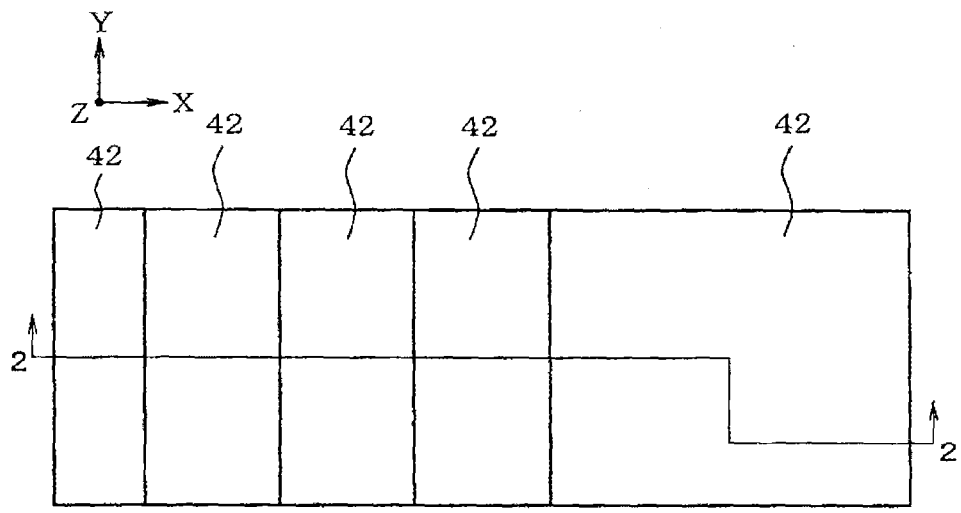
FIG. 4A illustrates one example of a planar layout illustrating one phase of the manufacturing process flow.
Figure 4B:
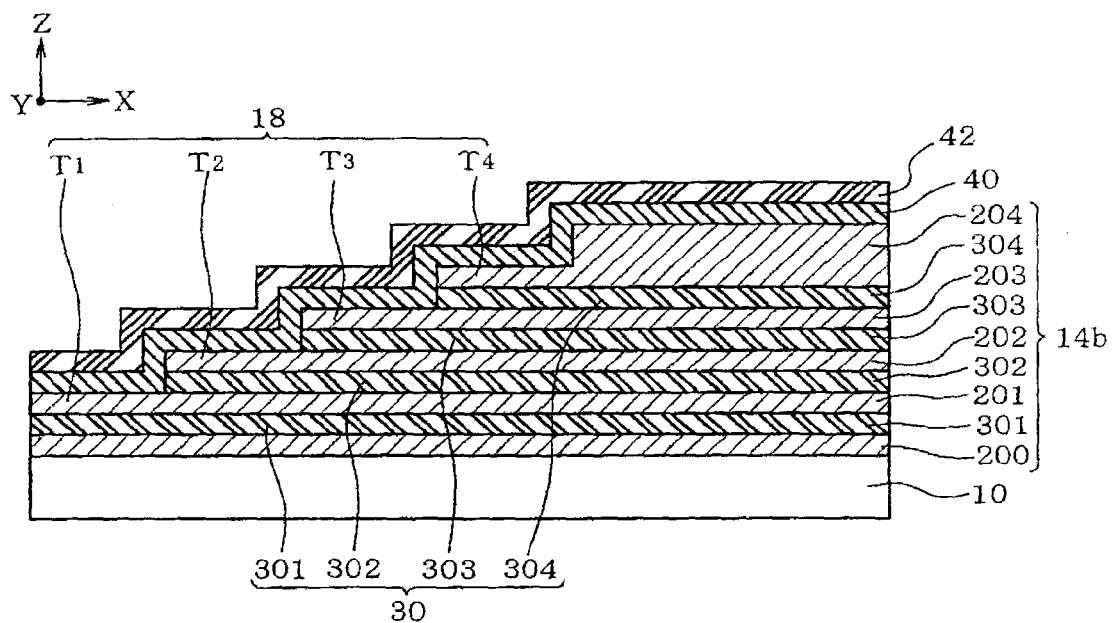
FIG. 4B is one example of a vertical cross-sectional view taken along line 2-2 of FIG. 4A and illustrates one phase of the manufacturing process flow.

Referring next to FIGS. 4A and 4B, liner insulating film 40 and stopper insulating film 42 are formed above steps 18 so as to extend along the stairway-like shape. A silicon oxide film maybe used for example as liner insulating film 40. The silicon oxide film may be formed by CVD. A silicon nitride film may be used for example as stopper insulating film 42. The silicon nitride film may be formed for example by CVD.

Figure 5A:
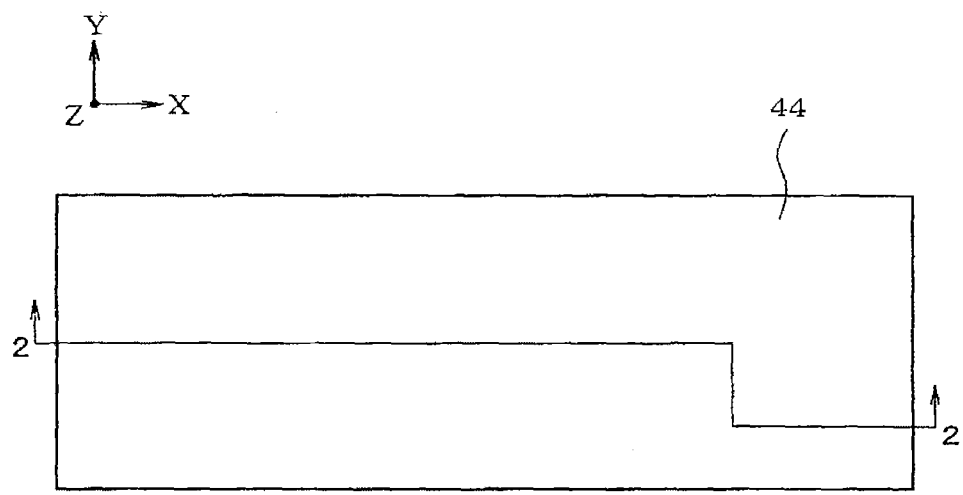
FIG. 5A illustrates one example of a planar layout illustrating one phase of the manufacturing process flow.
Figure 5B:
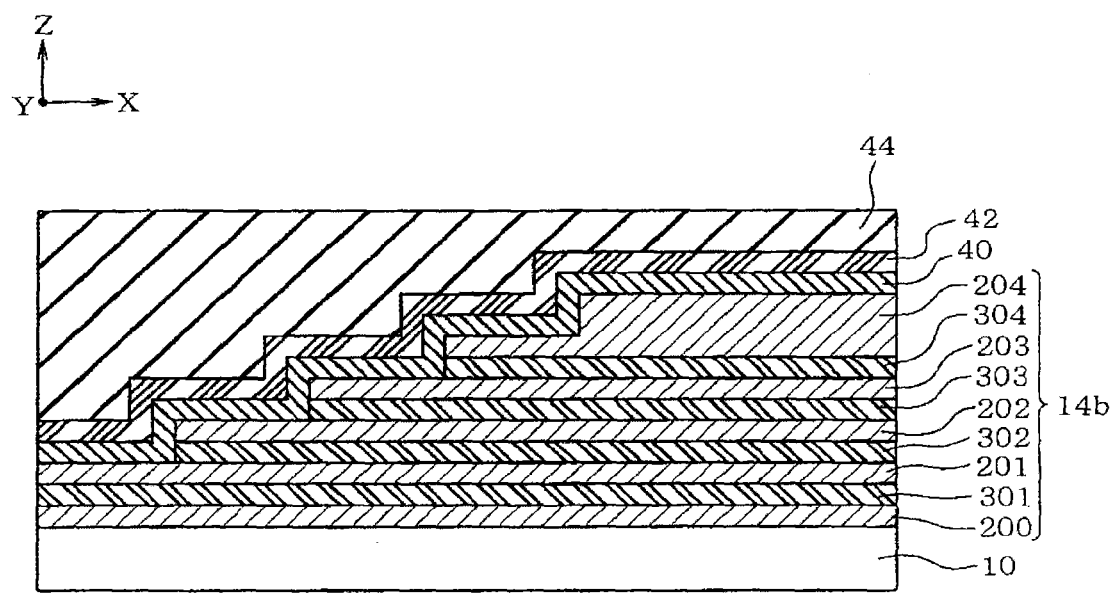
FIG. 5B is one example of a vertical cross-sectional view taken along line 2-2 of FIG. 5A and illustrates one phase of the manufacturing process flow.

Referring next to FIG. 5A and FIG. 5B, interlayer insulating film 44 is formed above stopper insulating film 42. A silicon oxide film may be used for example as interlayer insulating film 44. The silicon oxide film may be formed for example by CVD.

Figure 6A:
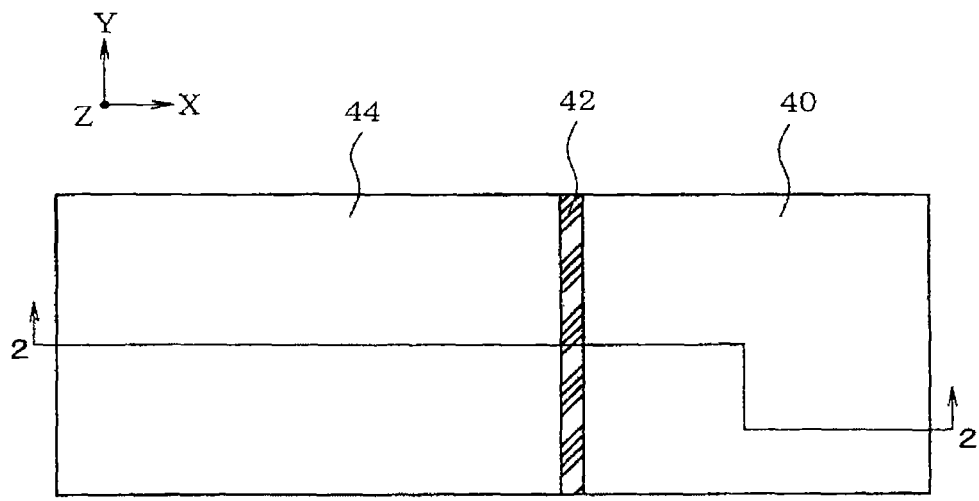
FIG. 6A illustrates one example of a planar layout illustrating one phase of the manufacturing process flow.
Figure 6B:
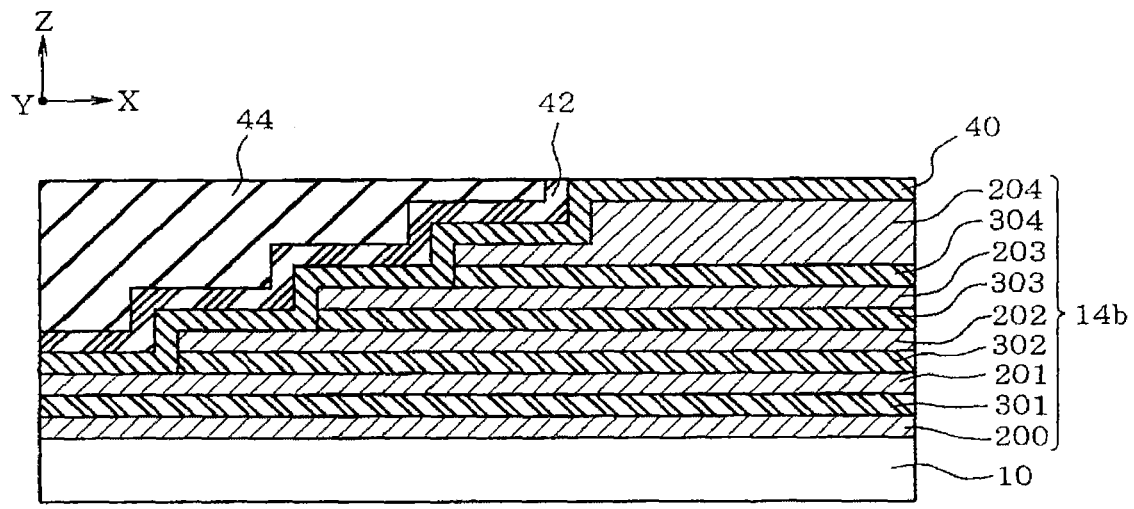
FIG. 6B is one example of a vertical cross-sectional view taken along line 2-2 of FIG. 6A and illustrates one phase of the manufacturing process flow.

Next, as illustrated in FIGS. 6A and 6B, interlayer insulating film 44 is polished by CMP (Chemical Mechanical Polishing) and interlayer insulating film 44 and stopper insulating film 42 are removed by polishing until the surface of liner insulating film 40 is exposed.

Thus, the upper surface of the resulting structure is planarized to the height of the surface of liner insulating film 40 to obtain a planar surface formed of interlayer insulating film 44, stopper insulating film 42, and liner insulating film 40.

Figure 7A:
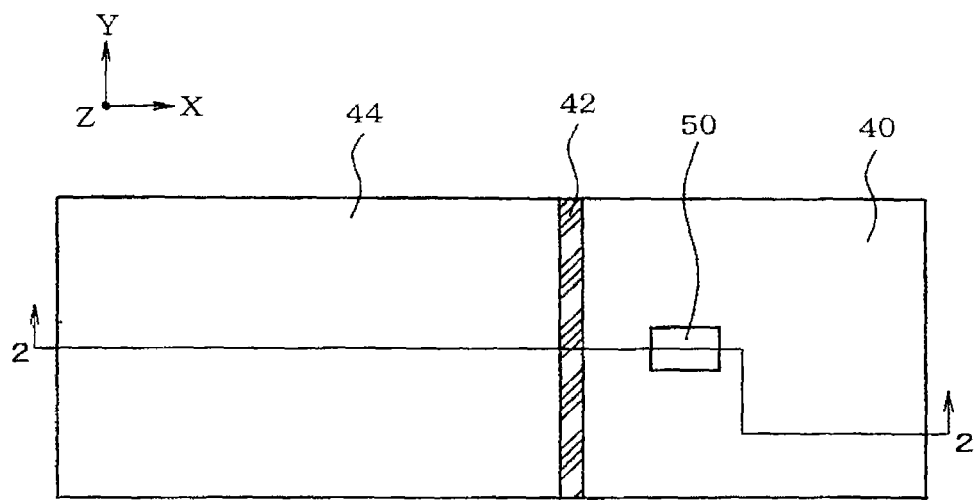
FIG. 7A illustrates one example of a planar layout illustrating one phase of the manufacturing process flow.
Figure 7B:
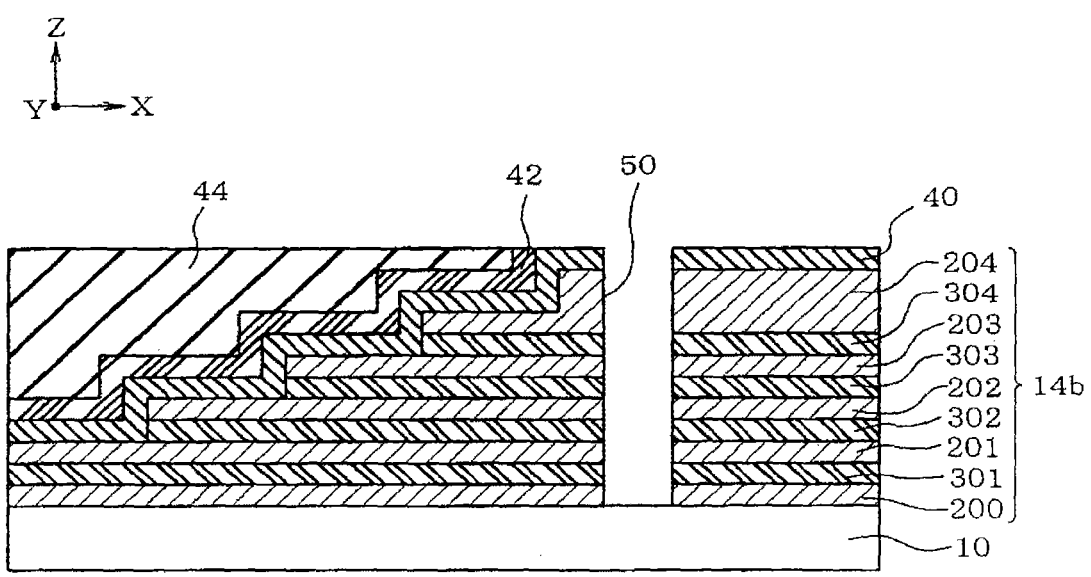
FIG. 7B is one example of a vertical cross-sectional view taken along line 2-2 of FIG. 7A and illustrates one phase of the manufacturing process flow.

Referring next to FIGS. 7A and 7B, first trench 50 is formed. First trench 50 extends from the surface of liner insulating film 40 and through stack structure 14b to reach the surface of semiconductor substrate 10. First trench 50 maybe formed by using lithography and RIE (Reactive Ion Etching).

Figure 8A:
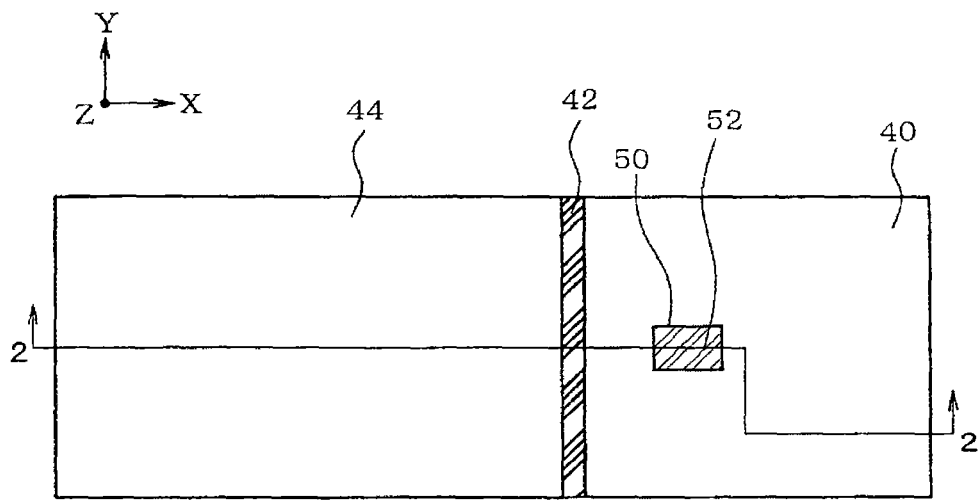
FIG. 8A illustrates one example of a planar layout illustrating one phase of the manufacturing process flow.
Figure 8B:
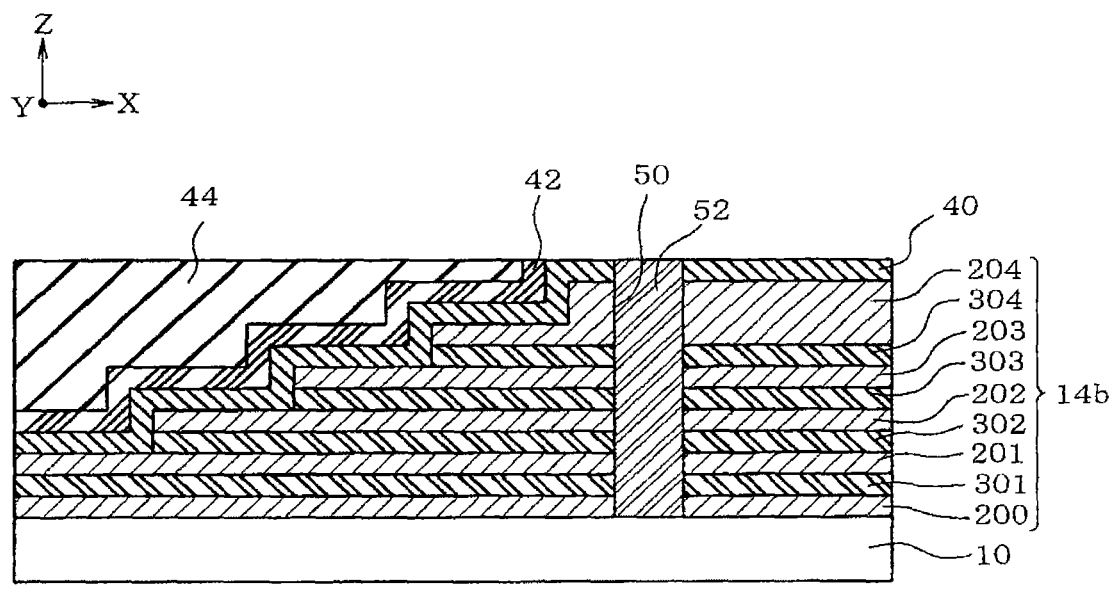
FIG. 8B is one example of a vertical cross-sectional view taken along line 2-2 of FIG. 8A and illustrates one phase of the manufacturing process flow.

Referring next to FIGS. 8A and 8B, first insulating film pillar 52 is formed by filling first trench 50 with an insulating film. First insulating film pillar 52 is formed for example by forming an insulating film along the surface of and inside first trench 50 followed by CMP or RIE etch back. A silicon oxide film may be used for example as an insulating film filled as first insulating film pillar 52. The silicon oxide film may be formed for example by CVD. First insulating film pillar 52 is configured to support electrode films 16 formed with cavities 60 disposed therebetween in the later described process step.

Figure 9A:
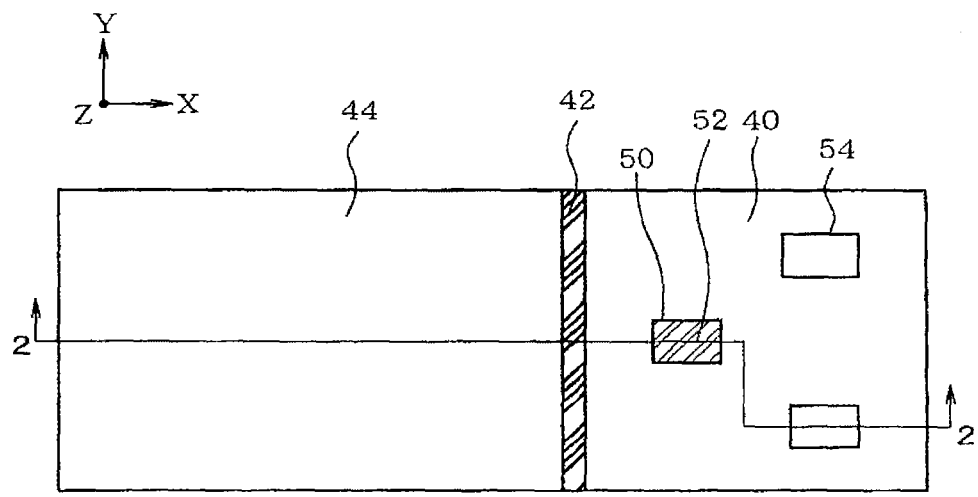
FIG. 9A illustrates one example of a planar layout illustrating one phase of the manufacturing process flow.
Figure 9B:
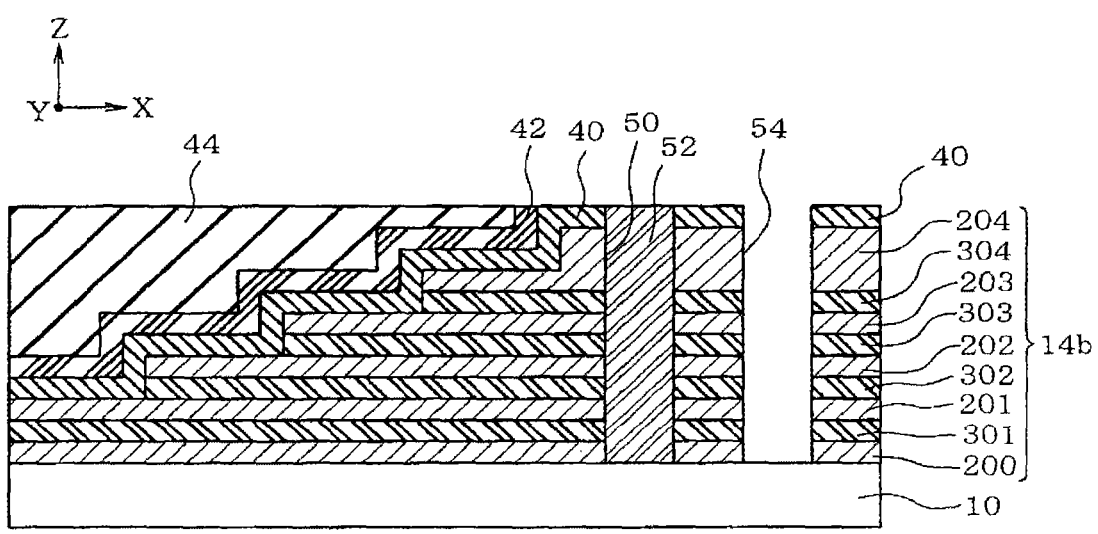
FIG. 9B is one example of a vertical cross-sectional view taken along line 2-2 of FIG. 9A and illustrates one phase of the manufacturing process flow.

Referring next to FIGS. 9A and 9B, second trench 54 is formed. Second trench 54 extends from the surface of liner insulating film 40 and through stack structure 14b to reach the surface of semiconductor substrate 10. First trench 50 may be formed for example by lithography and RIE.

Figure 10A:
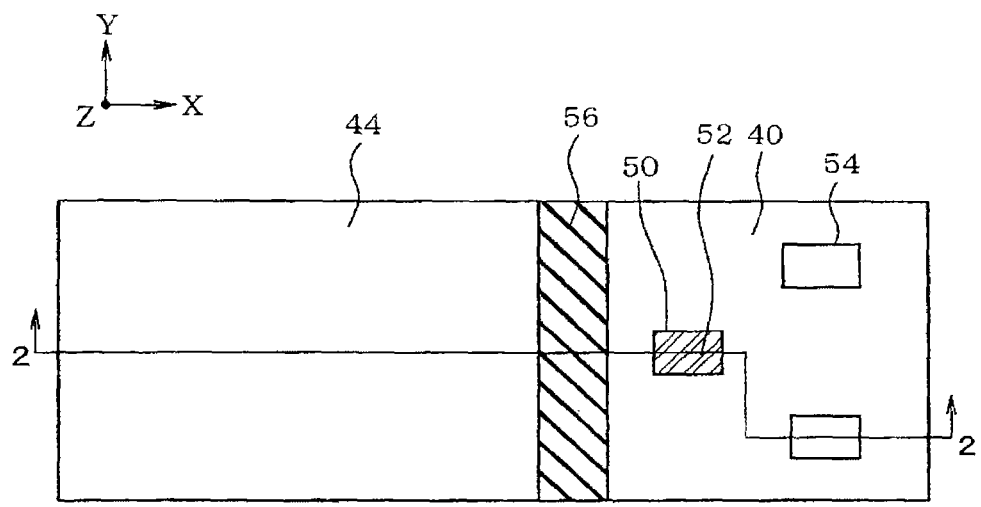
FIG. 10A illustrates one example of a planar layout illustrating one phase of the manufacturing process flow.
Figure 10B:
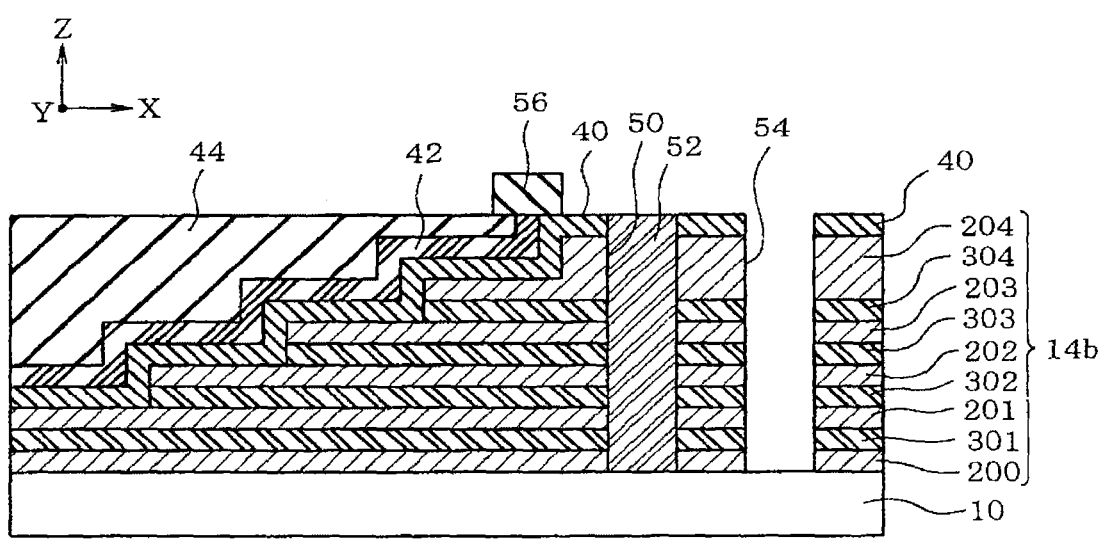
FIG. 10B is one example of a vertical cross-sectional view taken along line 2-2 of FIG. 10A and illustrates one phase of the manufacturing process flow.

Referring next to FIGS. 10A and 10B, mask film 56 is formed so as to cover the exposed surface of stopper insulating film 42. An amorphous carbon film for example may be used in forming mask film 56. Amorphous carbon may be formed for example by CVD. The pattern of mask film 56 may be formed for example by using lithography and RIE. Mask film 56 may be formed prior to forming second trench 54.

Figure 11A:
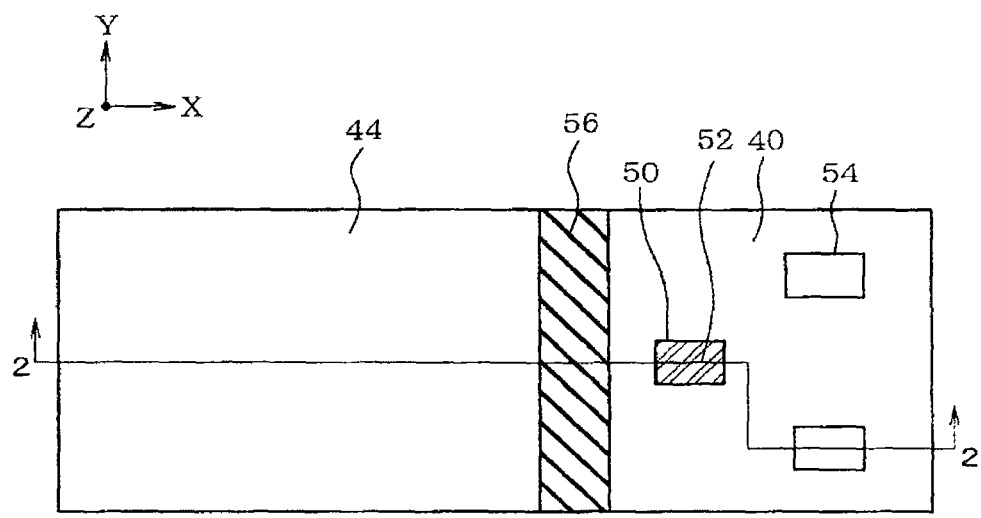
FIG. 11A illustrates one example of a planar layout illustrating one phase of the manufacturing process flow.
Figure 11B:
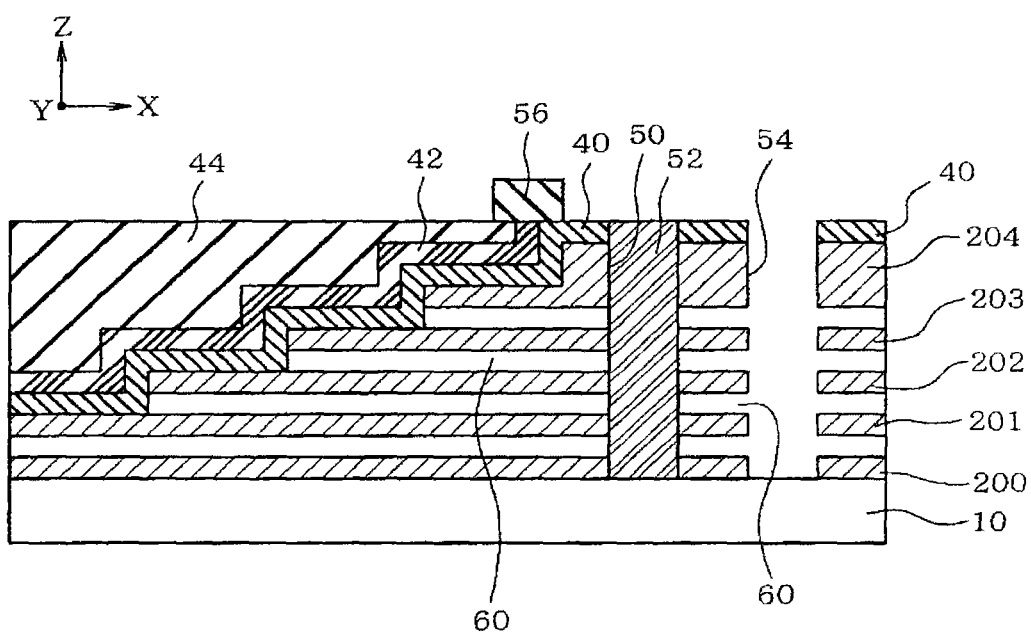
FIG. 11F is one example of a vertical cross-sectional view taken along line 2-2 of FIG. 11A and illustrates one phase of the manufacturing process flow.

Referring next to FIGS. 11A and 11B, second insulating film 30 is etched away via second trench 54. As described earlier, second insulating film 30 is formed for example of a silicon nitride film. In this example, second insulating film 30 may be wet etched using hot phosphoric acid for example. It is possible to secure sufficient selectivity of second insulating film 30 to other films such as first insulating film 20, liner insulating film 40, and mask film 56 by using hot phosphoric acid as the wet etchant and thereby selectively remove second insulating film 30 by etching. The etching forms cavities 60 where second insulating film, 30 existed.

Stopper insulating film 42 is formed of for example a silicon nitride film as described earlier. Thus, stopper insulating film 42, being masked by mask film 56, is not etched. Further, because cavities 60 are formed between first insulating films 20 by the removal of second insulating film 30 carried out by the etching, the mechanical strength of the structure is reduced. However, the support provided by first insulating film pillar 52 extending through first insulating films 20 prevents the collapse of first insulating films 20.

Figure 12A:
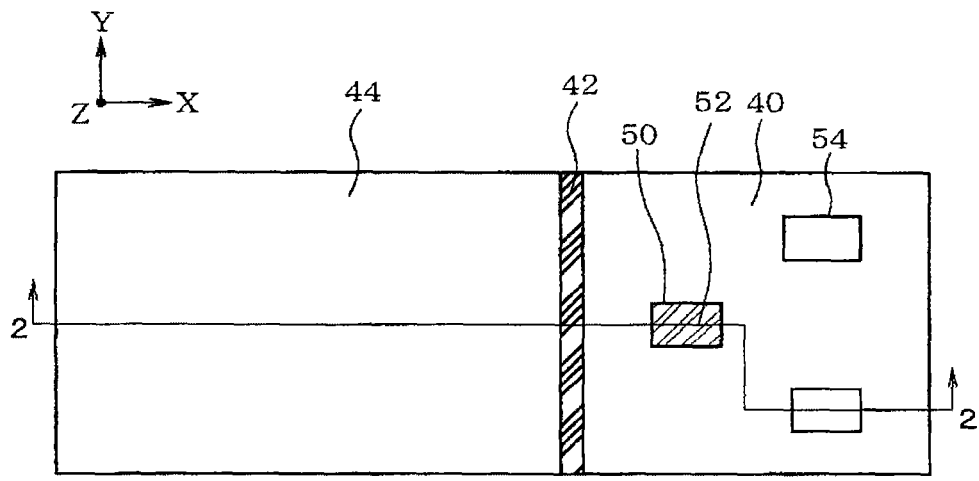
FIG. 12A illustrates one example of a planar layout illustrating one phase of the manufacturing process flow.
Figure 12B:
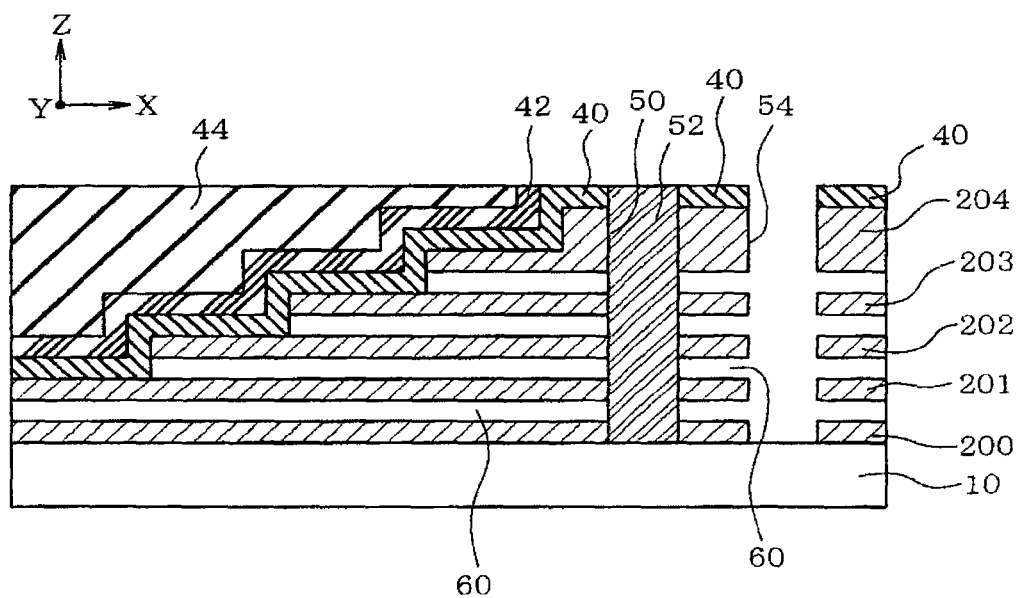
FIG. 12B is one example of a vertical cross-sectional view taken along line 2-2 of FIG. 12A and illustrates one phase of the manufacturing process flow.

Referring next to FIGS. 12A and 125, mask film 56 is removed. Mask film 56 may be removed for example by asking using oxygen plasma.

Figure 13A:
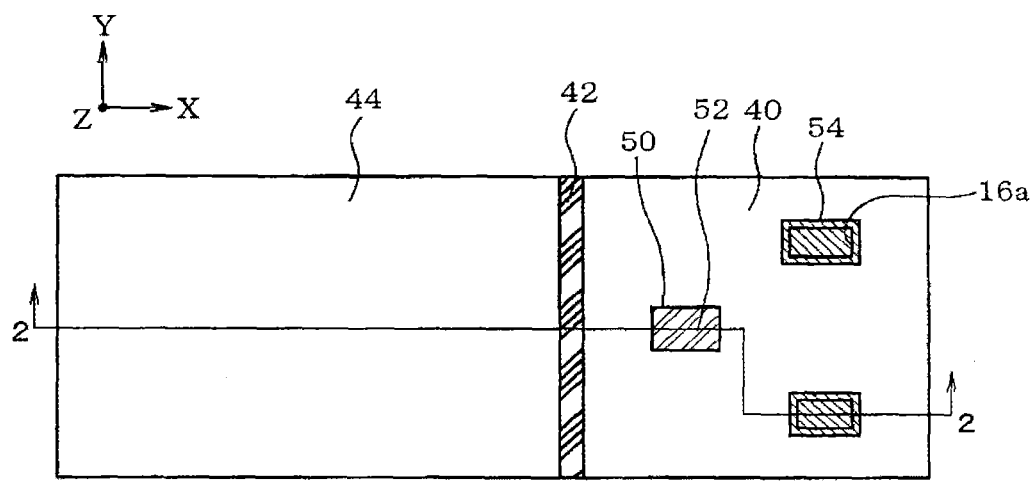
FIG. 13A illustrates one example of a planar layout illustrating one phase of the manufacturing process flow.
Figure 13B:
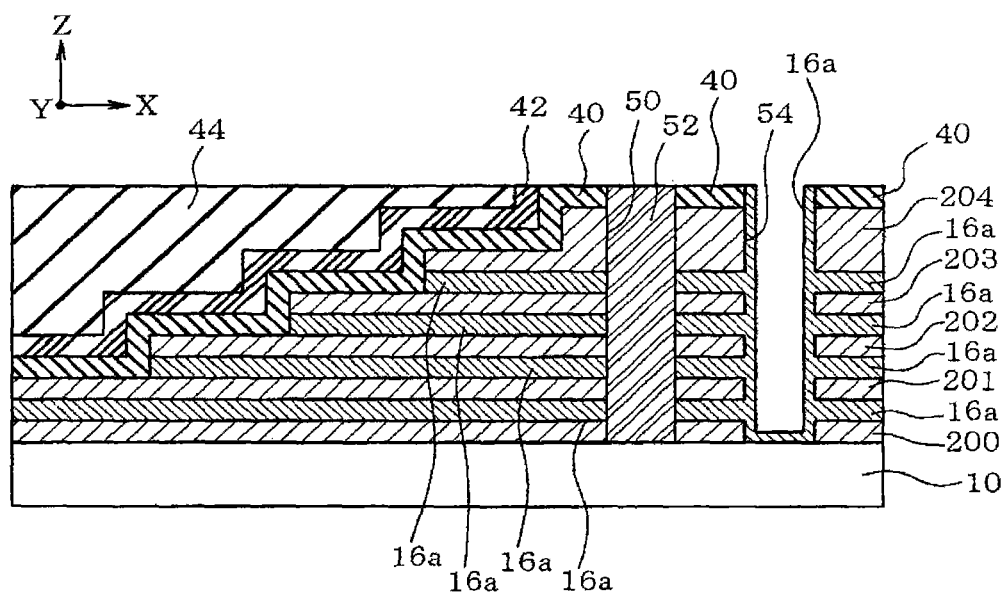
FIG. 13B is one example of a vertical cross-sectional view taken along line 2-2 of FIG. 13A and illustrates one phase of the manufacturing process flow.

Referring next to FIGS. 13A and 13B, conductive film 16a is formed. Conductive film 16a is later formed into electrode films 161, 162, 163, and 164. Metal such as tungsten (W) may be used for example as conductive film 16a. Tungsten may be formed for example by CVD. Tungsten may be formed under conditions providing good coverage. As a result, it is possible to form tungsten (conductive film 16a) far into cavities 60 and thereby fill cavities 60 with conductive film 16a. Conductive film 16a may be formed in a thickness so as not to fill second trench 54. This is in view of etching only the excess portions of conductive film 16a later in the process flow.

Figure 14A:
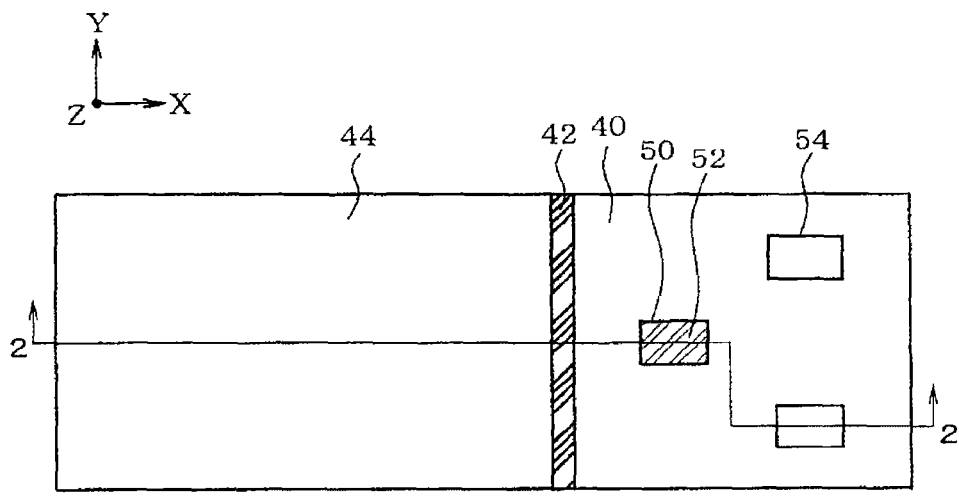
FIG. 14A illustrates one example of a planar layout illustrating one phase of the manufacturing process flow.
Figure 14B:
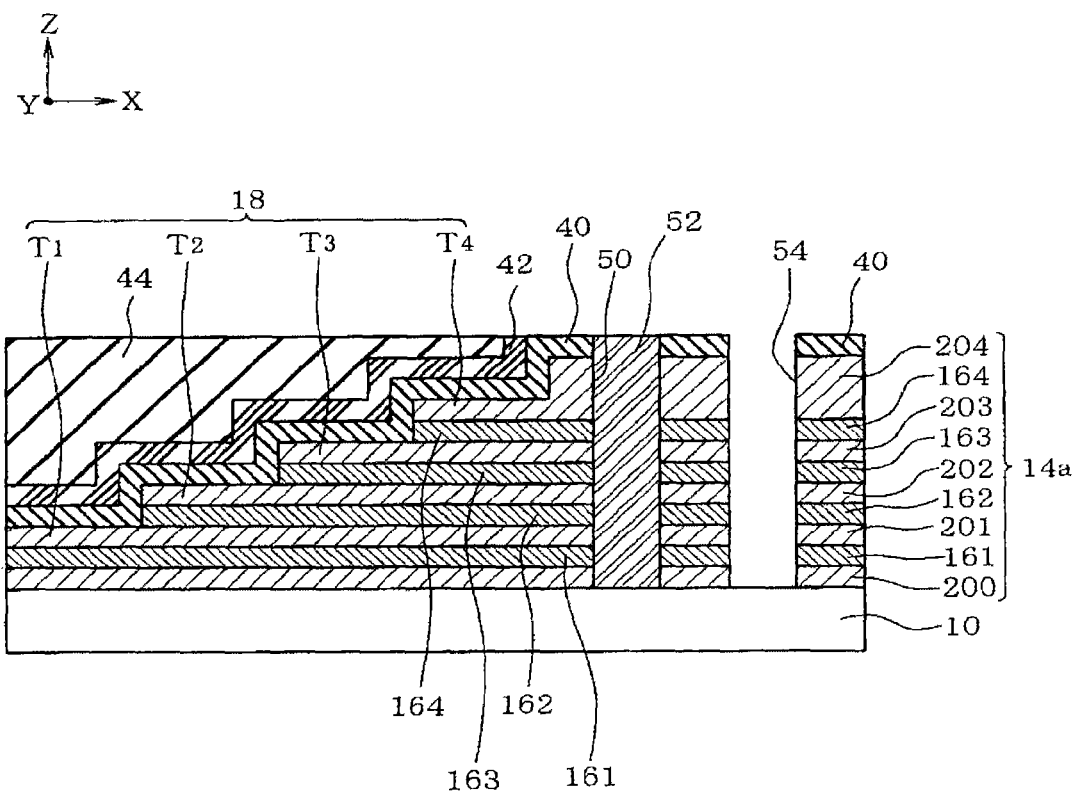
FIG. 14B is one example of a vertical cross-sectional view taken along line 2-2 of FIG. 14A and illustrates one phase of the manufacturing process flow.

Referring next to FIGS. 14A and 14S, the excess portions of conductive film 16a formed along the inner wall of second trench 54 is removed by etching. The removal of excess portions of conductive film 16a may be carried out by RIE and wet etching using a mixed solution containing hydrogen peroxide water ($H_2O_2$), choline (2-hydroxyethyl trimethyl ammonium hydroxide), and water (pure water). As a result, conductive film 16a formed in the cavities 60 is divided as separate electrode films 16 disposed within each cavity 60. As illustrated in the figures, electrode films 16 are divided in to electrode films 161, 162, 163, and 164. Electrode films 16 succeed the shape of second insulating films 30 and form terraces T which form steps 18. Stated differently, the above described process step replaces second insulating film 30 with electrode film 16.

Figure 15A:
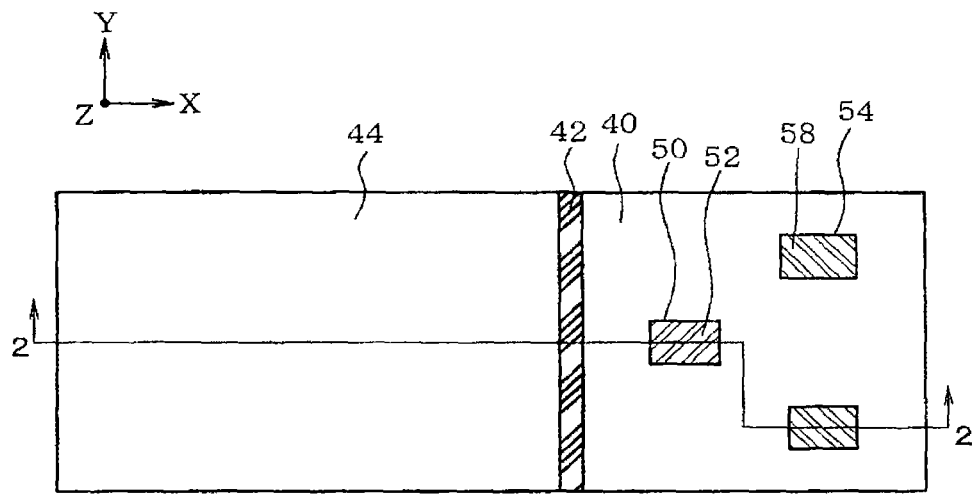
FIG. 15A illustrates one example of a planar layout illustrating one phase of the manufacturing process flow.
Figure 15B:
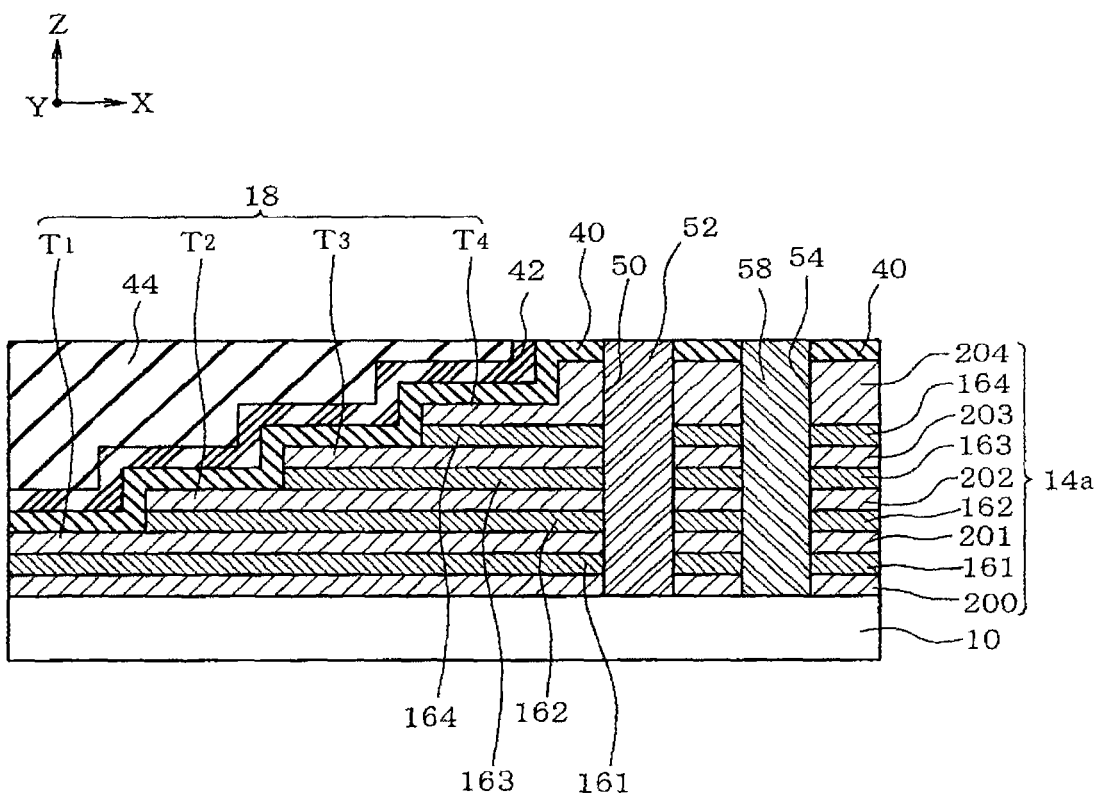
FIG. 15B is one example of a vertical cross-sectional view taken along line 2-2 of FIG. 15A and illustrates one phase of the manufacturing process flow.

Next, as illustrated in FIGS. 15A and 15B, second insulating film pillar 58 is formed by filling second trench 54 with an insulating film. A silicon oxide film may be used for example as the insulating film filled as second insulating film pillar 58.

Figure 16A:
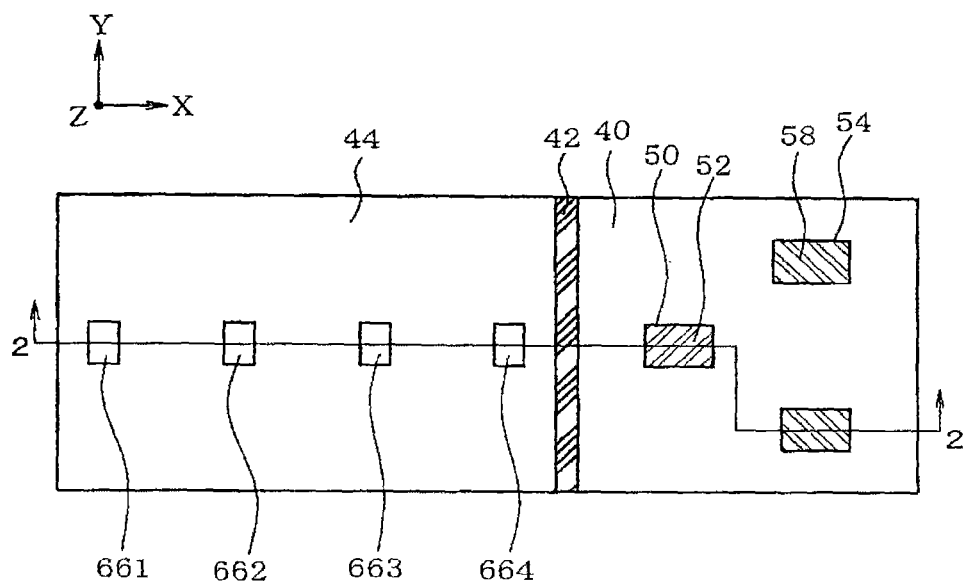
FIG. 16A illustrates one example of a planar layout illustrating one phase of the manufacturing process flow.
Figure 16B:
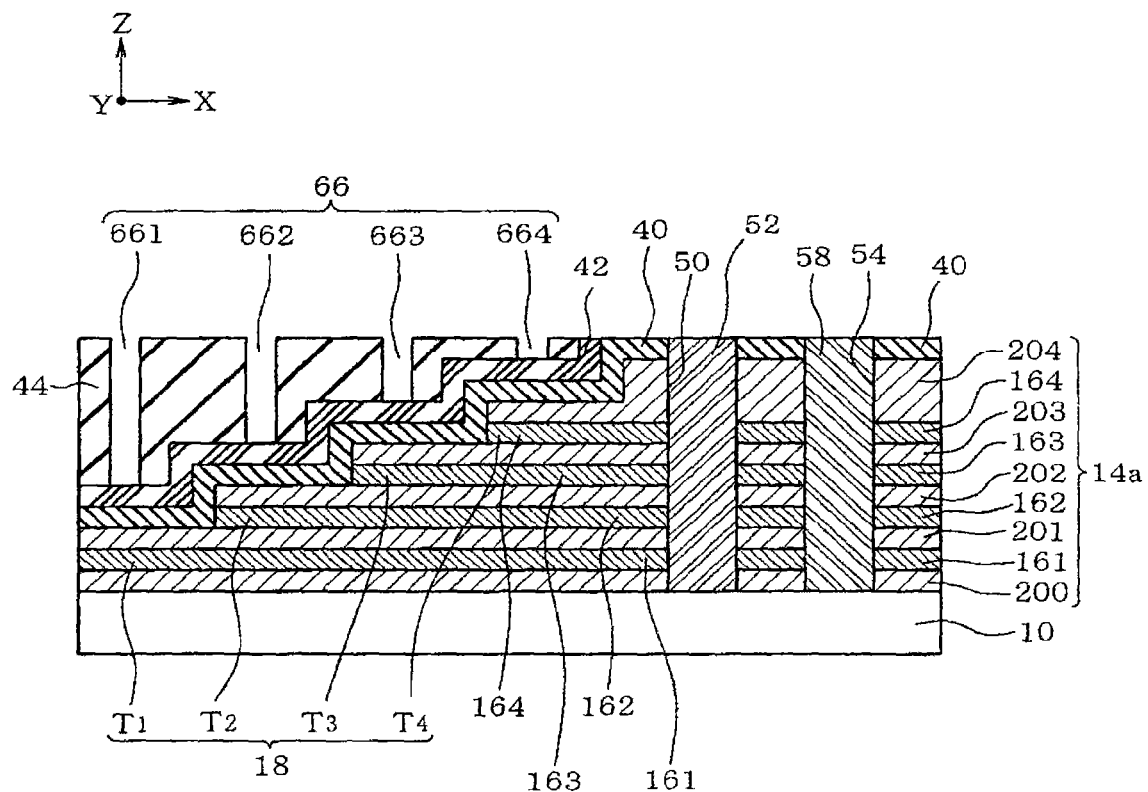
FIG. 16B is one example of a vertical cross-sectional view taken along line 2-2 of FIG. 16A and illustrates one phase of the manufacturing process flow.

Referring next to FIGS. 16A and 16B, holes 66 are formed. Holes 66 are formed so as to extend from and through the surface of interlayer insulating film 44 to reach the surface of stopper insulating film 42 of each of terraces T. Holes 66 are formed for example by lithography and RIE. RIE is performed under conditions that result in sufficiently higher etch rate for interlayer insulating film 44 (silicon oxide film) compared to the etch rate for stopper insulating film 42 (silicon nitride film) so that interlayer insulating film 44 is etched with selectivity to stopper insulating film 42. The etching is temporarily stopped on the surface of stopper insulating film 42. As a result, it is possible to absorb the difference in heights between deep contact holes 66 such as hole 661 and shallow contact holes 66 such as hole 664. It is thus, possible to make the etching conditions, such as the amount of etching at the bottom surfaces of holes 66 having different depths, to be even in subsequent etching of stopper insulating film 42 and liner insulating film 40. It is further possible to form contact plugs 68 with suppressed variance in contact resistance. It is also possible to prevent holes 66 from extending through electrode film 16. As a result, it is possible to improve the reliability of the semiconductor device.

Figure 17A:
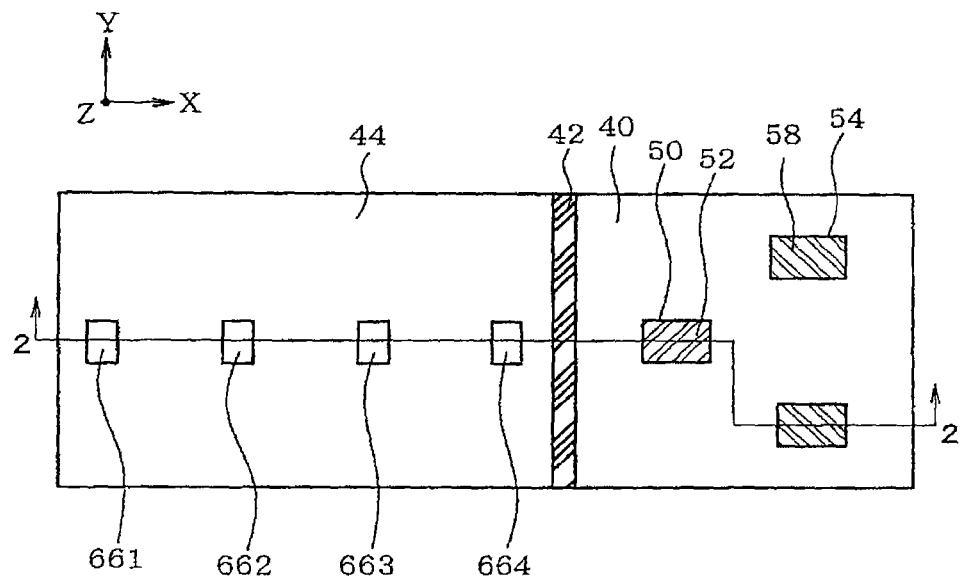
FIG. 17A illustrates one example of a planar layout illustrating one phase of the manufacturing process flow.
Figure 17B:
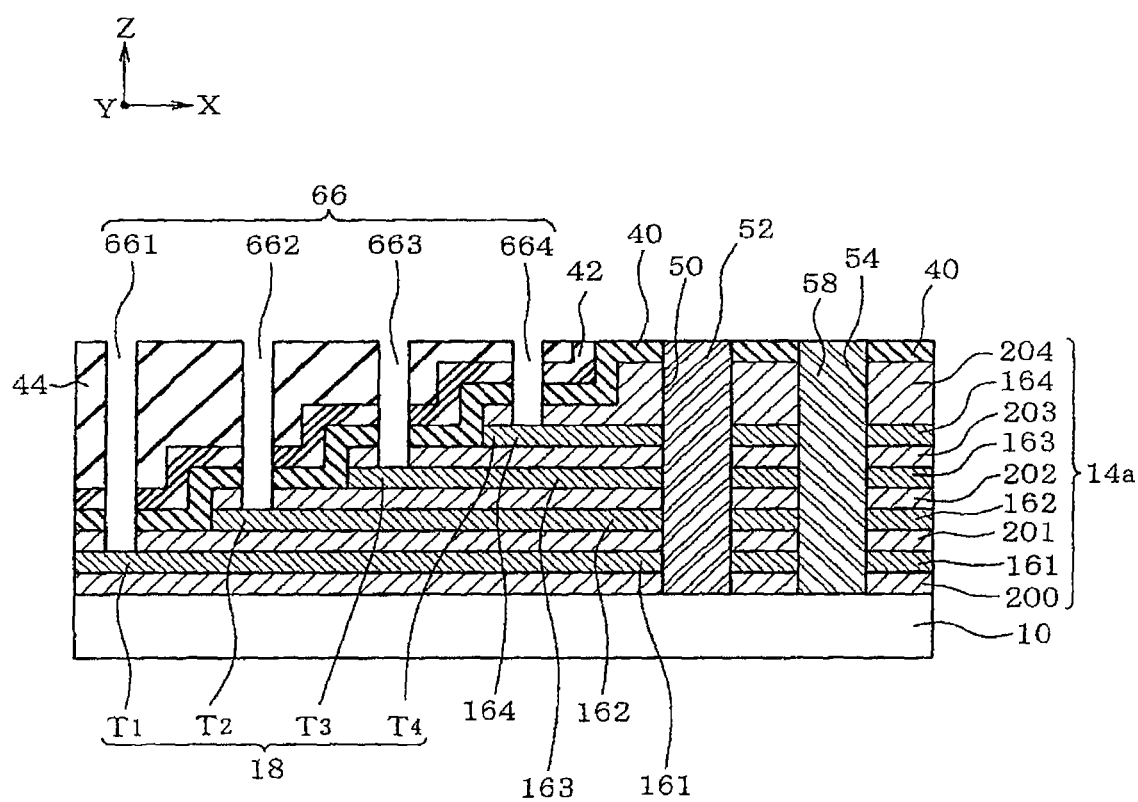
FIG. 17B is one example of a vertical cross-sectional view taken along line 2-2 of FIG. 17A and illustrates one phase of the manufacturing process flow.

Referring next to FIGS. 17A and 17B, stopper insulating film 42 and liner insulating film 40 are etched. The etching is performed successively to the etching illustrated in FIGS. 16A and 16B. Etching of stopper insulating film 42 and liner insulating film 40 may be carried out by changing the etching conditions so that etching conditions suitable for etching stopper insulating film 42 (silicon nitride film) is applied when etching stopper insulating film 42 and etching conditions suitable for etching liner insulating film 40 (silicon oxide film) is applied when etching liner insulating film 40. Alternatively, etching may be performed under conditions in which the difference between the etch rates of stopper insulating film 42 and liner insulating film 40 is small. The etching is performed with selectivity to electrode film 16 (tungsten) and is stopped on the surface of electrode film 16. As a result, holes 66 extending to the surfaces of electrode films 16 of each terrace T are formed.

Referring next to FIGS. 2A and 2B, contact plugs 68 are formed in holes 66. Contact plug 68 is formed by filling hole 66 with a conductive film. Contact plug 68 is connected to the upper surface of electrode film 16 of each terrace T. Tungsten may be used for example as a conductive film. Tungsten may be formed for example by CVD. After forming tungsten along the entire surface of the structure including the interior of holes 66 and the upper surface of the structure, tungsten formed above the upper surface of the structure is removed by CMP to leave tungsten inside holes 66. It this thus, possible to form contact plugs 68.

It is possible to form the semiconductor device of the present embodiment in the above described manner.

In the semiconductor device and the manufacturing method thereof of the present embodiment, it is possible to stop the formation of opening on stopper film 42 during the formation of holes 66. As a result, it is possible to form contact plugs 68 with reduced variance in contact resistance. It is further possible to prevent the conductive films in the lower layers from being shorted for example by the etching progressing through electrode films 16. As a result, it is possible to facilitate formation of holes extending to the terraces arranged like a stairway by enabling the formation of a stairway structure having an etch stop film formed above the metal film. It is thus, possible to provide a reliable semiconductor device and a method of manufacturing the same.

Embodiments described above may be applied to a NAND or a NOR-type flash memory, EEPROM, DRAM, SRAM, other types of semiconductor storage devices, or various types of logic devices, and to manufacturing process steps of the foregoing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming a stack structure above a substrate, the stack structure including a plurality of first insulating films and a plurality of second insulating films disposed alternately one above another;
    forming a stairway portion at least at one end portion of the stack structure, the stair way portion including a plurality of terraces provided with a stack of the first insulating film and the second insulating film;
    forming a third insulating film and a stopper film so as to cover an upper portion of the stack structure;
    forming an interlayer insulating film above the stopper film;
    forming a trench extending through the stack structure in portions of the stack structure where the stairway portion is not formed;
    selectively etching away the first insulating film via the trench to define cavities;
    filling the cavities with a metal film via the trench;
    removing an excess portion of the metal film in the trench to divide the metal film formed in each of the cavities;
    forming a fourth insulating film in the trench; and
    forming a plurality of holes extending from upper surfaces of the terraces and through the interlayer insulating film so as to reach an upper surface of the metal film of the terraces by performing a first etch stopping on the stopper film and a second etch etching through the stopper film.

2. The method according to claim 1, wherein the stopper film and the interlayer insulating film are made of different materials.

3. The method according to claim 1, wherein the stopper film and the third insulating film are made of different materials.

4. The method according to claim 1, wherein the stopper film comprises a silicon nitride film.

5. The method according to claim 1, wherein the interlayer insulating film comprises a silicon oxide film.

6. The method according to claim 1, wherein the first insulating film comprises a silicon oxide film.

7. The method according to claim 1, wherein the second insulating film comprises a silicon nitride film.

8. The method according to claim 1, wherein the third insulating film comprises a silicon oxide film.

9. The method according to claim 1 further comprising forming a pillar extending through the stack structure to reach the substrate between forming the third insulating film and the stopper film and forming the interlayer insulating film above the stopper film.

10. The method according to claim 9, wherein the pillar comprises an insulating film.

11. The method according to claim 9, wherein the pillar comprises a silicon oxide film.

* * * * *